US009370074B2

(12) United States Patent
Kurokawa

(10) Patent No.: US 9,370,074 B2
(45) Date of Patent: Jun. 14, 2016

(54) DISPLAY DEVICE WITH IMAGING FUNCTION AND METHOD FOR DRIVING THE SAME

(75) Inventor: Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 157 days.

(21) Appl. No.: 13/288,425

(22) Filed: Nov. 3, 2011

(65) Prior Publication Data

US 2012/0113160 A1  May 10, 2012

(30) Foreign Application Priority Data

Nov. 5, 2010  (JP) .................................. 2010-248010

(51) Int. Cl.
*H05B 33/14* (2006.01)

(52) U.S. Cl.
CPC .................................... *H05B 33/145* (2013.01)

(58) Field of Classification Search
CPC .................... G02F 1/133514; G02F 1/133509; G02F 1/133516; G02F 1/13473; G02F 1/1335; G02F 2201/52; G02F 2001/13312; G02F 1/133; G02F 1/13338; G06F 3/042; G06F 3/0412; G06F 3/0421
USPC ..................... 345/76, 84, 173, 175, 207, 211, 345/690–695, 80–108; 313/504, 506, 507; 257/79–90, 225; 349/116
See application file for complete search history.

(56) References Cited

U.S. PATENT DOCUMENTS

| | | | |
|---|---|---|---|
| 6,424,326 B2 | 7/2002 | Yamazaki et al. | |
| 6,507,010 B1 | 1/2003 | Yamazaki et al. | |
| 6,724,012 B2 | 4/2004 | Kimura | |
| 6,747,290 B2 | 6/2004 | Yamazaki et al. | |
| 6,798,145 B2 | 9/2004 | Ishizuka | |
| 6,828,951 B2 | 12/2004 | Yamazaki et al. | |
| 7,091,936 B1 | 8/2006 | Yamada | |
| 7,102,673 B2 | 9/2006 | Kimura | |
| 7,161,185 B2 | 1/2007 | Yamazaki et al. | |
| 7,173,279 B2 | 2/2007 | Yamazaki et al. | |
| 7,218,349 B2 | 5/2007 | Kimura | |
| 7,342,256 B2 | 3/2008 | Yamazaki | |
| 7,397,064 B2 | 7/2008 | Yamazaki et al. | |
| 7,430,025 B2 | 9/2008 | Okamoto et al. | |
| 7,473,935 B2 * | 1/2009 | Chen ............................... 257/90 |
| 7,609,606 B2 | 10/2009 | Nagatomi et al. | |

(Continued)

FOREIGN PATENT DOCUMENTS

EP  2 249 201 A1  11/2010
JP  2001-109399 A  4/2001

(Continued)

*Primary Examiner* — Kent Chang
*Assistant Examiner* — Herbert L Hagemeier
(74) *Attorney, Agent, or Firm* — Husch Blackwell LLP

(57) ABSTRACT

To achieve desired display on a display surface and accurate image capture in a display device with an imaging function. A light source for display (a first light-emitting element) and a light source for image capture (a second light-emitting element) that does not adversely affect display when it is on are separately provided in the display device with an imaging function. In the display device, an image can be appropriately captured using the light source for image capture in a period during which display is performed using the light source for display. Consequently, desired display on the display surface and accurate image capture can be achieved in the display device.

24 Claims, 6 Drawing Sheets

(56) References Cited

U.S. PATENT DOCUMENTS

| | | | |
|---|---|---|---|
| 7,629,610 B2 | 12/2009 | Yamazaki et al. | |
| 7,663,165 B2 | 2/2010 | Mouli | |
| 7,719,182 B2* | 5/2010 | Cok et al. | 313/506 |
| 7,923,920 B2* | 4/2011 | Nakamura | 313/504 |
| 7,924,272 B2* | 4/2011 | Boer et al. | 345/175 |
| 7,964,879 B2 | 6/2011 | Yamazaki | |
| 7,965,266 B2* | 6/2011 | Yamaguchi et al. | 345/84 |
| 8,378,391 B2* | 2/2013 | Koyama et al. | 257/225 |
| 8,416,227 B2* | 4/2013 | Fujioka et al. | 345/207 |
| 8,907,928 B2 | 12/2014 | Yamaguchi et al. | |
| 2003/0146696 A1* | 8/2003 | Park et al. | 313/506 |
| 2005/0116621 A1* | 6/2005 | Bellmann et al. | 313/503 |
| 2006/0113549 A1* | 6/2006 | Den et al. | 257/79 |
| 2006/0214892 A1 | 9/2006 | Harada et al. | |
| 2008/0024479 A1* | 1/2008 | Jung et al. | 345/211 |
| 2008/0211786 A1 | 9/2008 | Park et al. | |
| 2009/0141004 A1 | 6/2009 | Yamazaki | |
| 2010/0007632 A1 | 1/2010 | Yamazaki | |
| 2010/0134735 A1* | 6/2010 | Nakamura et al. | 349/116 |
| 2010/0188354 A1 | 7/2010 | Tamura | |
| 2010/0220117 A1* | 9/2010 | Kimura | 345/690 |
| 2010/0220269 A1* | 9/2010 | Takama et al. | 349/106 |
| 2010/0283765 A1* | 11/2010 | Gotoh et al. | 345/175 |
| 2010/0300862 A1 | 12/2010 | Tamura et al. | |
| 2011/0042766 A1 | 2/2011 | Kurokawa et al. | |
| 2011/0096009 A1* | 4/2011 | Kurokawa et al. | 345/173 |
| 2011/0108706 A1 | 5/2011 | Koyama | |

FOREIGN PATENT DOCUMENTS

| | | |
|---|---|---|
| JP | 2003-092183 A | 3/2003 |
| JP | 2005-332880 A | 12/2005 |
| JP | 2006-065305 A | 3/2006 |
| JP | 2006-209939 A | 8/2006 |
| JP | 2006-276223 | 10/2006 |
| JP | 2006-301864 A | 11/2006 |
| JP | 2006-308796 A | 11/2006 |
| JP | 2008-129574 A | 6/2008 |
| JP | 2008-209939 A | 9/2008 |
| JP | 2009-535819 | 10/2009 |
| JP | 2010-097420 | 4/2010 |
| WO | WO 2008/027392 A1 | 3/2008 |
| WO | WO 2009/110294 A1 | 9/2009 |

* cited by examiner

DISPLAY DEVICE WITH IMAGING FUNCTION AND METHOD FOR DRIVING THE SAME

BACKGROUND OF THE INVENTION

1. Field of the Invention

The present invention relates to a display device with an imaging function and a method for driving the display device. In particular, the present invention relates to a display device with an imaging function that irradiates an object to be detected with light emitted therefrom and detects light reflected from the object, and a method for driving the display device.

2. Description of the Related Art

Display devices in which display on a screen can be operated when a user touches the screen (i.e., touch panels) have been developed in recent years. For example, Patent Document 1 discloses a display device (a touch panel) in which adverse effect of external light on image capture of an object to be detected can be reduced. Specifically, the display device disclosed in Patent Document 1 can capture an image of an object to be detected with less effect of external light by capturing an image in a state where a display surface emits light and an image in a state where the display surface does not emit light to detect a difference between the two images.

REFERENCE

Patent Document 1: Japanese Published Patent Application No. 2006-276223

SUMMARY OF THE INVENTION

In the display device disclosed in Patent Document 1, light used for display is utilized for image capture. In other words, an image is captured by detecting light reflected from an object to be detected. For that reason, an object to be captured is affected by display on the display device. Specifically, for example, it is difficult to capture an image of an object in a region where black is expressed in the display device. On the other hand, when the entire display surface emits light to capture an image, it is difficult to perform desired display, for example.

In view of the foregoing problems, an object of one embodiment of the present invention is to achieve desired display on a display surface and accurate image capture. Another object of one embodiment of the present invention is to realize a display device having the above feature with a simple structure. Note that one embodiment of the present invention aims to achieve at least one of the above objects.

The above object can be achieved by separately providing a light source for display and a light source for image capture, which does not adversely affect display when it is on, in a display device. Here, in order to prevent the light source for image capture in the on state from adversely affecting display, it is necessary that the area irradiated with light emitted from the light source for image capture is smaller than the display surface, and that a lighting period of the light source for image capture is short. The main point of one embodiment of the present invention is to use a light-emitting element (e.g., an organic electroluminescent element (also referred to as an organic EL element) as the light source for image capture that satisfies such conditions. Note that in a display device including the light-emitting elements as a light source for display and a light source for image capture, the light source for image capture with approximately the same size as the light source for display provided in a display element can be provided, and thus the area of the light source for image capture can be smaller than that in a liquid crystal display device including LEDs as a backlight. Moreover, it is easy to shorten the lighting period because such a display device has no limitation such as the response speed of liquid crystal in a liquid crystal display device.

As for the light-emitting elements included in a display device according to one embodiment of the present invention, a light-emitting layer that can emit white light is shared between the light source for display and the light source for image capture. In other words, the light source for display and the light source for image capture are formed by appropriately providing electrodes included in the light source for display and the light source for image capture for one light-emitting layer. Consequently, a step of forming the light-emitting layer into a desired shape is not needed, and the light source for display and the light source for image capture can be simply formed. Note that in the display device, white light emitted from the light source for display is changed into chromatic light by a color filter, and display is performed using the chromatic light.

Specifically, one embodiment of the present invention is a display device that includes a first light-emitting element and a second light-emitting element emitting white light, a color filter capable of absorbing light with a wavelength in a first specific range included in the white light and capable of transmitting light with a wavelength in a second specific range included in the white light, and a photodiode generating a photocurrent by being irradiated with the white light or the light with a specific wavelength included in the white light. The light with the wavelength in the second specific range is chromatic light, and display is performed using the chromatic light based on the light emitted from the first light-emitting element. An image is captured by irradiating an object to be detected with the light emitted from the second light-emitting element or the light with the specific wavelength included in the light emitted from the second light-emitting element, and irradiating the photodiode with light reflected from the object.

In a display device according to one embodiment of the present invention, a light source for display (a first light-emitting element) and a light source for image capture (a second light-emitting element) that does not adversely affect display when it is on are separately provided. In the display device, an image can be appropriately captured using the light source for image capture in a period during which display is performed using the light source for display. Consequently, desired display on a display surface and accurate image capture can be achieved in the display device.

DETAILED DESCRIPTION OF THE INVENTION

Embodiments of the present invention will be hereinafter described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

<Structure Example of Display Device>

First, an example of the structure of a display device according to one embodiment of the present invention will be described with reference to FIG. 1, FIGS. 2A to 2C, and FIG. 3.

Figure 1:
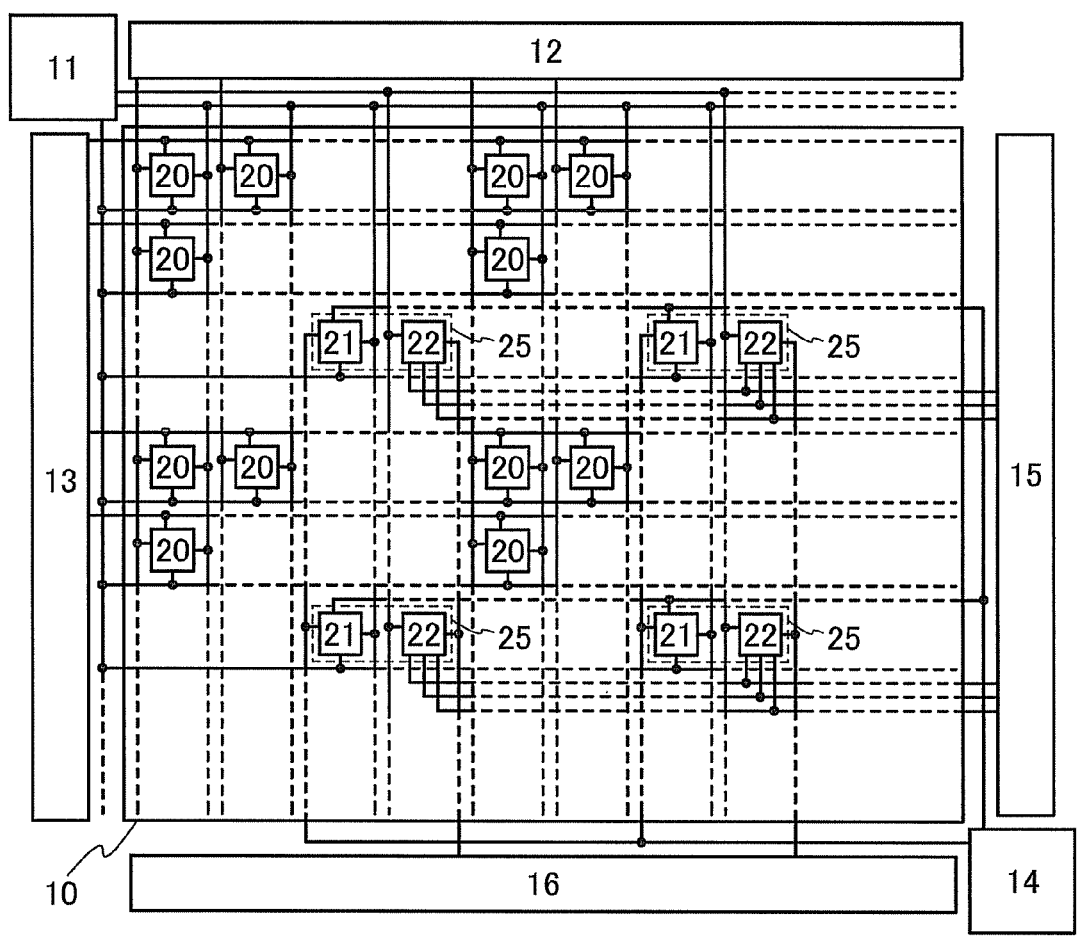
FIG. 1 illustrates a structure example of a display device.

FIG. 1 illustrates a structure example of a display device according to one embodiment of the present invention. The display device illustrated in FIG. 1 includes a pixel portion 10, a power source circuit 11, a signal line driver circuit 12, a scan line driver circuit 13, an imaging light source driver circuit 14, an optical sensor driver circuit 15, and an imaging-signal read circuit 16. Further, the pixel portion 10 includes a plurality of display elements 20 arranged in matrix and imaging elements 25 arranged in matrix. The imaging element 25 includes an imaging light source element 21 and an optical sensor 22.

Figure 2A:
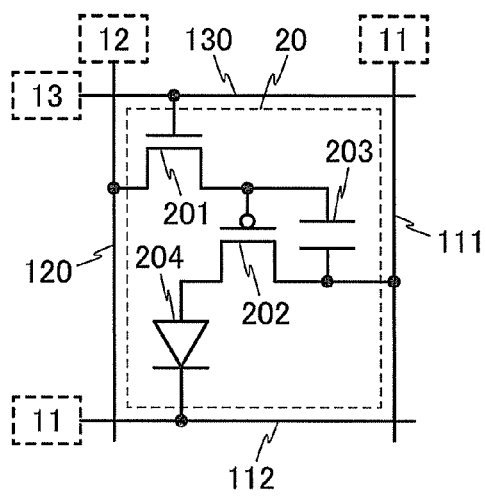
FIGS. 2A to 2C are circuit diagrams illustrating structure examples of a display element, a light source element for image capture, and an optical sensor, respectively.

FIG. 2A is a circuit diagram illustrating an example of the configuration of the display element 20 illustrated in FIG. 1. The display element 20 in FIG. 2A includes an n-channel transistor 201, a p-channel transistor 202, a capacitor 203, and a light-emitting element 204. A gate of the n-channel transistor 201 is electrically connected to a scan line 130. One of a source and a drain of the n-channel transistor 201 is electrically connected to a signal line 120. A gate of the p-channel transistor 202 is electrically connected to the other of the source and the drain of the n-channel transistor 201. One of a source and a drain of the p-channel transistor 202 is electrically connected to a wiring 111 that supplies a high power supply potential (VDD) (hereinafter referred to as the high power supply potential line 111). One electrode of the capacitor 203 is electrically connected to the other of the source and the drain of the n-channel transistor 201 and the gate of the p-channel transistor 202. The other electrode of the capacitor 203 is electrically connected to the high power supply potential line 111. An anode of the light-emitting element 204 is electrically connected to the other of the source and the drain of the p-channel transistor 202. A cathode of the light-emitting element 204 is electrically connected to a wiring 112 that supplies a low power supply potential (VSS) (hereinafter referred to as the low power supply potential line 112).

The scan line 130 is a wiring whose potential is controlled by the scan line driver circuit 13. The signal line 120 is a wiring whose potential is controlled by the signal line driver circuit 12. The high power supply potential line 111 is a wiring to which the high power supply potential (VDD), which is a fixed potential, is supplied from the power source circuit 11. The low power supply potential line 112 is a wiring to which the low power supply potential (VSS), which is a fixed potential, is supplied from the power source circuit 11. In addition, the scan line 130 is provided for every row of the plurality of display elements 20 arranged in matrix in the pixel portion 10. The potentials of the plurality of scan lines 130 provided for every row of the display elements 20 are independently controlled by the scan line driver circuit 13. Similarly, the signal line 120 is provided for every column of the plurality of display elements 20 arranged in matrix in the pixel portion 10. The potentials of the plurality of signal lines 120 provided for every column of the display elements 20 are independently controlled by the signal line driver circuit 12.

Figure 2B:
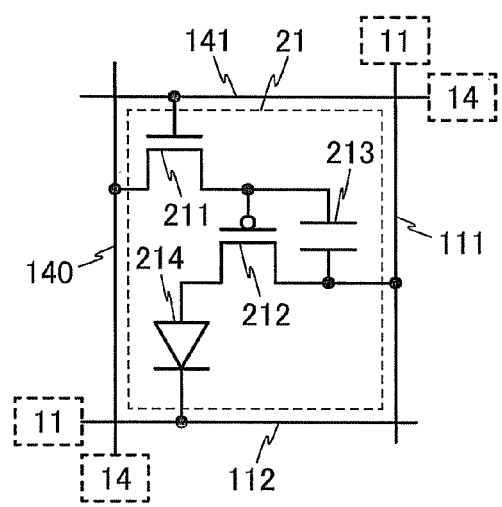

FIG. 2B is a circuit diagram illustrating an example of the configuration of the imaging light source element 21 included in the imaging element 25 illustrated in FIG. 1. The imaging light source element 21 in FIG. 2B includes an n-channel transistor 211, a p-channel transistor 212, a capacitor 213, and a light-emitting element 214. The circuit configuration of the imaging light source element 21 in FIG. 2B is the same as the display element 20 in FIG. 2A; therefore, the detailed description is not repeated. Note that the imaging light source element 21 in FIG. 2B differs from the display element 20 in FIG. 2A in that a gate of the n-channel transistor 211 is electrically connected to a lighting-period control signal line 141 and one of a source and a drain thereof is electrically connected to an on/off control signal line 140. Furthermore, it is preferable that the light-emitting element 214 included in the imaging light source element 21 can emit more instantaneous and intense light than the light-emitting element 204 included in the display element 20. Therefore, the current drive capability of the p-channel transistor 212 is preferably higher than that of the p-channel transistor 202. For example, the W/L of the p-channel transistor 212 is preferably higher than that of the p-channel transistor 202. Here, W represents the channel width and L represents the channel length.

The lighting-period control signal line 141 is provided for every row of the plurality of imaging elements 25 arranged in matrix in the pixel portion 10. In addition, the plurality of lighting-period control signal lines 141 provided for every row of the imaging elements 25 are electrically connected to the imaging light source driver circuit 14 through a common wiring. That is, the potentials of the plurality of lighting-period control signal lines 141 are collectively controlled by the imaging light source driver circuit 14. Similarly, the on/off control signal line 140 is provided for every column of the plurality of imaging elements 25 arranged in matrix in the pixel portion 10. Moreover, the plurality of on/off control signal lines 140 provided for every column of the imaging elements 25 are electrically connected to the imaging light source driver circuit 14 through a common wiring. That is, the potentials of the plurality of on/off control signal lines 140 are collectively controlled by the imaging light source driver circuit 14.

Figure 2C:
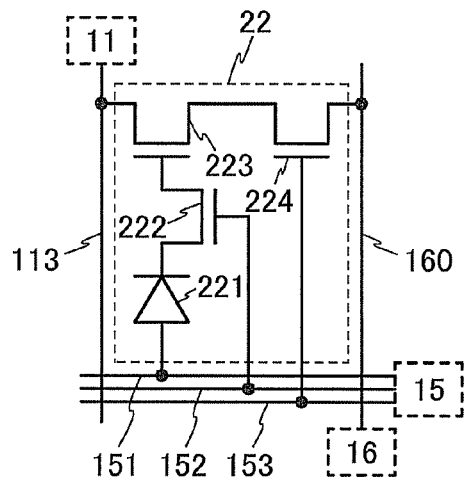

FIG. 2C is a circuit diagram illustrating an example of the configuration of the optical sensor 22 included in the imaging element 25 illustrated in FIG. 1. The optical sensor 22 in FIG. 2C includes a photodiode 221, an n-channel transistor 222, an n-channel transistor 223, and an n-channel transistor 224. An anode of the photodiode 221 is electrically connected to a reset signal line 151. A gate of the n-channel transistor 222 is electrically connected to an imaging-period control signal line 152. One of a source and a drain of the n-channel transistor 222 is electrically connected to a cathode of the photodiode 221. A gate of the n-channel transistor 223 is electrically connected to the other of the source and the drain of the n-channel transistor 222. One of a source and a drain of the n-channel transistor 223 is electrically connected to a wiring 113 that supplies a reference potential (Vref) (hereinafter referred to as the reference potential line 113). A gate of the n-channel transistor 224 is electrically connected to a reading-period control signal line 153. One of a source and a drain of the n-channel transistor 224 is electrically connected to the other of the source and the drain of the n-channel transistor 223. The other of the source and the drain of the n-channel transistor 224 is electrically connected to a read signal line 160.

Note that the reset signal line 151, the imaging-period control signal line 152, and the reading-period control signal line 153 are wirings whose potentials are controlled by the optical sensor driver circuit 15. The reference potential line 113 is a wiring to which the reference potential (Vref), which is a fixed potential, is supplied from the power source circuit 11. The reset signal line 151, the imaging-period control signal line 152, and the reading-period control signal line 153 are provided for every row of the plurality of imaging elements 25 arranged in matrix in the pixel portion 10. The potentials of the plurality of reset signal lines 151 provided for every row of the imaging elements 25 are controlled independently or collectively by the optical sensor driver circuit 15. Further, the potentials of the plurality of imaging-period control signal lines 152 provided for every row of the imaging elements 25 are controlled independently or collectively by the optical sensor driver circuit 15. The potentials of the plurality of reading-period control signal lines 153 provided for every row of the imaging elements 25 are controlled independently by the optical sensor driver circuit 15. The read signal line 160 is provided for every column of the plurality of imaging elements 25 arranged in matrix in the pixel portion 10. The potentials of the plurality of read signal lines 160 provided for every column of the imaging elements 25 are judged by the imaging-signal read circuit 16.

Figure 3:
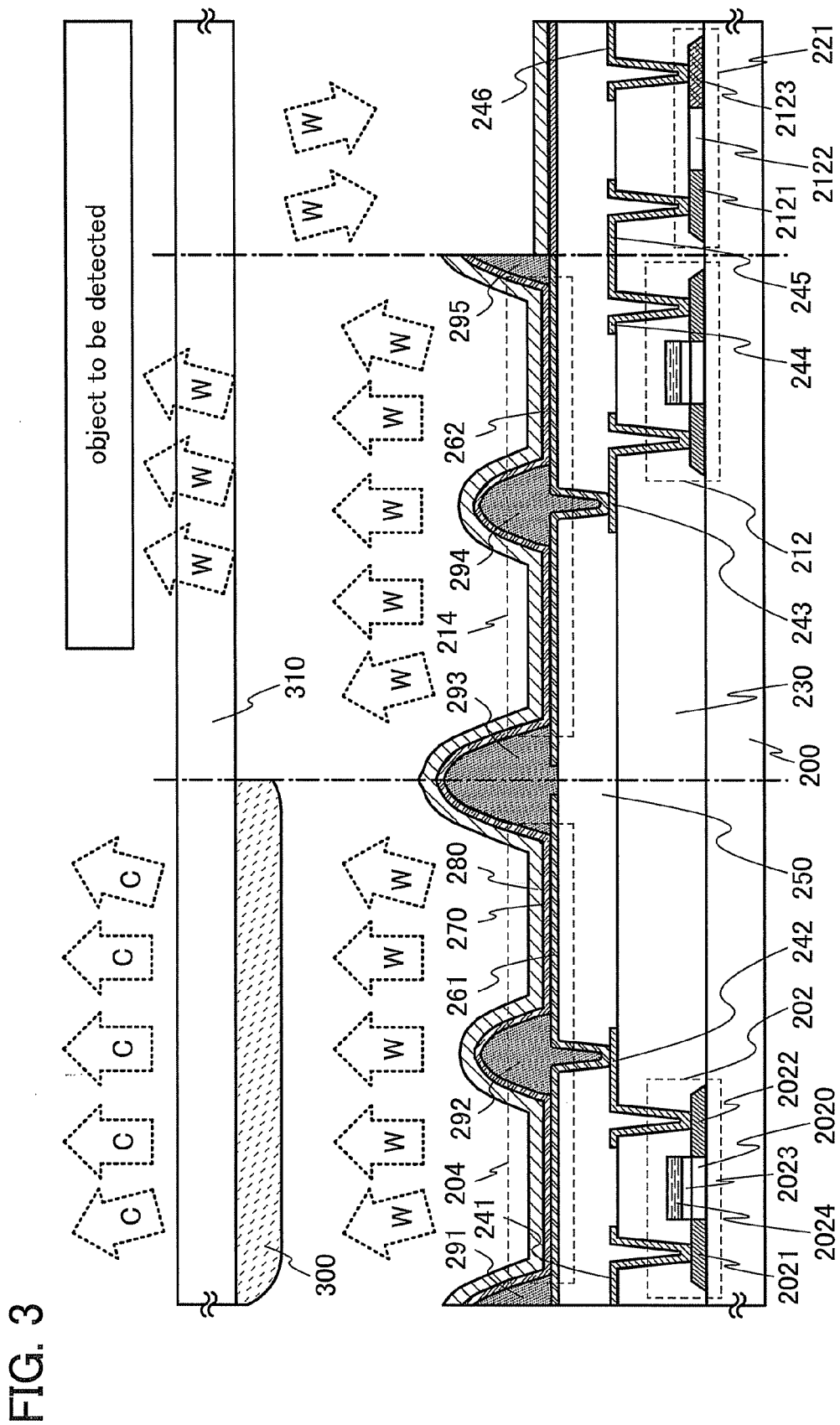
FIG. 3 is a cross-sectional view illustrating a structure example of a display device.

FIG. 3 is a cross-sectional view illustrating a structure example of part of the display device disclosed in this specification. Specifically, FIG. 3 illustrates the p-channel transistor 202 and the light-emitting element 204 illustrated in FIG. 2A, the p-channel transistor 212 and the light-emitting element 214 illustrated in FIG. 2B, and the photodiode 221 illustrated in FIG. 2C.

The p-channel transistor 202 includes p-type impurity regions 2021 and 2022 and a channel formation region 2020 that are formed using single crystal silicon provided over a substrate 200 having an insulating surface, a gate insulating layer 2023 provided over the channel formation region 2020, and a gate layer 2024 provided over the gate insulating layer 2023. The p-channel transistor 212 can be a transistor having a structure similar to that of the p-channel transistor 202. Note that the example where the p-channel transistors 202 and 212 are formed using single crystal silicon is shown here; alternatively, these transistors can be formed using polycrystalline silicon or amorphous silicon. In addition, the p-channel transistors 202 and 212 are top-gate transistors here; however, they are not limited to top-gate transistors and may be bottom-gate transistors or the like.

The photodiode 221 can have any structure as long as it generates a photocurrent by being irradiated with light emitted from the light-emitting element 214 or light with a specific wavelength included in the light. Here, the photodiode 221 is a PIN photodiode including a p-type impurity region 2121, an i-type region 2122, and an n-type impurity region 2123 that are formed using single crystal silicon provided over the substrate 200 having an insulating surface. Alternatively, a PN diode can be applied to the photodiode 221. Moreover, the structure of the photodiode 221 is preferably selected in accordance with the intended wavelength. For example, a photodiode formed using amorphous silicon is preferably used to detect light in the visible wavelength region, and a photodiode formed using single crystal silicon or polycrystalline silicon is preferably used to detect light in a wavelength region including infrared rays.

An insulating layer 230 is provided over the p-channel transistors 202 and 212 and the photodiode 221. The p-type or n-type impurity region included in the p-channel transistors 202 and 212 and the photodiode 221 is electrically connected to any of electrode layers 241 to 246 in an opening in the insulating layer 230. Furthermore, an insulating layer 250 is provided over the electrode layers 241 to 246.

The light-emitting element 204 includes an electrode layer 261 connected to the electrode layer 242 in an opening in the insulating layer 250, a light-emitting layer 270 provided over the electrode layer 261, and an electrode layer 280 provided over the light-emitting layer 270. The light-emitting element 214 includes an electrode layer 262 connected to the electrode layer 243 in an opening in the insulating layer 250, the light-emitting layer 270 provided over the electrode layer 262, and the electrode layer 280 provided over the light-emitting layer 270. The light-emitting layer 270 and the electrode layer 280 are thus shared between the light-emitting elements 204 and 214 in FIG. 3. Consequently, a step of forming the light-emitting layer 270 into a desired shape is not needed, and the light source for display and the light source for image capture can be simply formed. Further, since the light-emitting elements 204 and 214 are formed without a step of processing the light-emitting layer 270 into a desired shape, the reliability and yield of the display device can be improved.

Note that here, the light-emitting layer 270 can emit white light (W) with a current generated between the electrode layer 261 or the electrode layer 262 and the electrode layer 280, and the white light (W) at least has a wavelength of red light, a wavelength of green light, a wavelength of blue light, and a wavelength of yellow light. For example, the light-emitting elements 204 and 214 can be an organic electroluminescent element. In addition, the electrode layer 280 is formed using a light-transmitting conductive film here. As a result, the light-emitting elements 204 and 214 can emit white light (W) at least in the direction where the electrode layer 280 is provided. Further, partition layers 291 to 295 are provided at edges of the electrode layers 261 and 262 and in the openings in the insulating layer 250. Note that the partition layer is formed from an organic insulator or an inorganic insulator. By providing the partition layers 291 to 295, short circuit between the electrode layer 261 or the electrode layer 262 and the electrode layer 280 can be prevented and disconnection of the light-emitting layer 270 can be suppressed. Here, the light-emitting elements 204 and 214 are provided to overlap the respective p-channel transistors 202 and 212. For that reason, the area of the light-emitting elements 204 and 214 (the aperture ratio of the display device) can be increased.

In addition, the display device in FIG. 3 includes a color filter 300 and a light-transmitting sealing substrate 310. A region where the light-emitting elements 204 and 214 and the like are placed is sealed by the substrate 200 having an insulating surface and the sealing substrate 310. Thus, moisture can be prevented from being mixed into the light-emitting elements 204 and 214 and the like, so that the reliability of the display device can be increased. The color filter 300 is provided directly above the region where the light-emitting element 204 is placed. The color filter 300 can absorb light with a wavelength in a specific range, which is included in white light (W) emitted from the light-emitting element 204, and change it into chromatic light (C). Note that here, the chromatic color is red, green, blue, or yellow.

The color filter is not provided directly above the light-emitting element 214 and the photodiode 221. Consequently, in the display device in FIG. 3, an image of an object to be detected can be captured by irradiating the object with white light (W) emitted from the light-emitting element 214 and irradiating the photodiode 221 with white light (W) reflected from the object.

<Example of Image Capture Method for Display Device>

Next, an example of an image capture method for the above-described display device will be described with reference to FIGS. 4A and 4B.

Figure 4A:
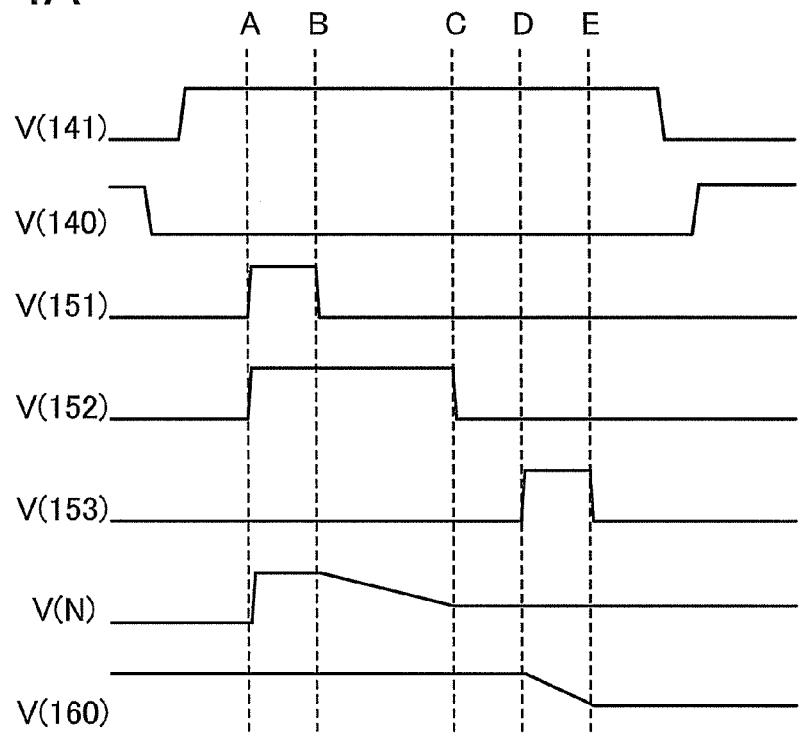
FIGS. 4A and 4B illustrate examples of an image capture method for a display device.
Figure 4B:
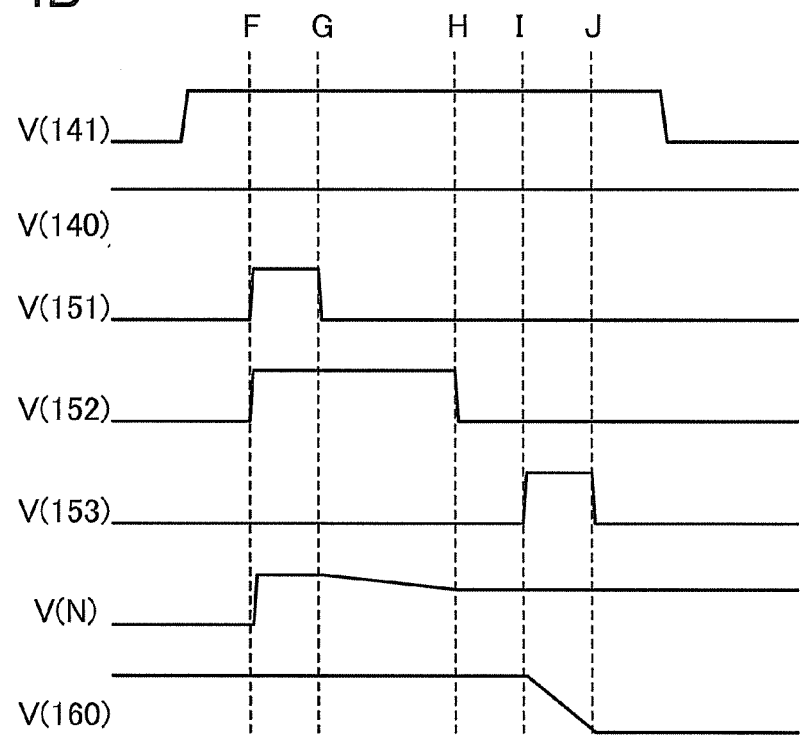

FIGS. 4A and 4B illustrate an example of a method for capturing an image by the imaging element 25 illustrated in FIG. 1 and FIGS. 2B and 2C. Specifically, FIG. 4A illustrates an example of capturing an image while the light-emitting element 214 included in the imaging light source element 21 emits light. FIG. 4B illustrates an example of capturing an image while the light-emitting element 214 included in the imaging light source element 21 does not emit light. Note that in FIGS. 4A and 4B, V(141) is the potential of the lighting-period control signal line 141; V(140) is the potential of the on/off control signal line 140; V(151) is the potential of the reset signal line 151; V(152) is the potential of the imaging-period control signal line 152; V(153) is the potential of the reading-period control signal line 153; V(N) is the potential of a node where the other of the source and the drain of the n-channel transistor 222 and the gate of the n-channel transistor 223 are electrically connected to each other; and V(160) is the potential of the read signal line 160.

In the example of the image capture method illustrated in FIG. 4A, before a time A, the potential (V(140)) of the on/off control signal line 140 is set at a low-level potential and the potential (V(141)) of the lighting-period control signal line 141 is set at a high-level potential. Thus, the n-channel transistor 211 and the p-channel transistor 212 illustrated in FIG. 2B are turned on. Consequently, the light-emitting element 214 emits light.

At the time A, the potential (V(151)) of the reset signal line 151 and the potential (V(152)) of the imaging-period control signal line 152 are set at a high-level potential (a reset operation starts). At this time, the potential (V(N)) of the node is set at a reset potential.

At a time B, the potential (V(151)) of the reset signal line 151 is set at a low-level potential (the reset operation ends and a storage operation starts). At that time, the rate of change in the potential (V(N)) of the node varies depending on the amount of light with which the photodiode 221 is irradiated. Here, the potential of the node is decreased more rapidly as the amount of light emitted to the photodiode 221 is larger.

At a time C, the potential (V(152)) of the imaging-period control signal line 152 is set at a low-level potential (the storage operation ends). After that, the potential (V(N)) of the node has a fixed value. Note that the larger the amount of light emitted to the photodiode 221 in the storage operation is, the lower the potential (V(N)) of the node becomes.

At a time D, the potential (V(153)) of the reading-period control signal line 153 is set at a high-level potential (a selection operation starts). At this time, the potential (V(160)) of the read signal line 160 is changed in accordance with the potential (V(N)) of the node, that is, the gate voltage of the n-channel transistor 223 illustrated in FIG. 2C. Here, when the potential (V(160)) of the read signal line 160 is set at a high-level potential in advance, the potential (V(160)) of the read signal line 160 becomes lower as the gate voltage of the n-channel transistor 223 is higher. Here, the gate voltage of the n-channel transistor 223 becomes lower as the amount of light emitted to the photodiode 221 is larger; therefore, the potential (V(160)) of the read signal line 160 becomes higher as the amount of light emitted to the photodiode 221 is larger.

At a time E, the potential (V(153)) of the reading-period control signal line 153 is set at a low-level potential (the selection operation ends). Thus, the potential (V(160)) of the read signal line 160 becomes a fixed value. After that, the potential (V(160)) of the read signal line 160 is judged by the imaging-signal read circuit 16.

In the example of the image capture method illustrated in FIG. 4B, before a time F, the potential (V(140)) of the on/off control signal line 140 is set at a high-level potential and the potential (V(141)) of the lighting-period control signal line 141 is set at a high-level potential. Thus, the n-channel transistor 211 illustrated in FIG. 2B is turned on and the p-channel transistor 212 is turned off. As a result, the light-emitting element 214 does not emit light.

At the time F, the potential (V(151)) of the reset signal line 151 and the potential (V(152)) of the imaging-period control signal line 152 are set at a high-level potential (a reset operation starts). At this time, the potential (V(N)) of the node is set at a reset potential.

At a time G, the potential (V(151)) of the reset signal line 151 is set at a low-level potential (the reset operation ends and a storage operation starts). At that time, the rate of change in the potential (V(N)) of the node varies depending on the amount of light emitted to the photodiode 221. Since the light-emitting element 214 does not emit light in the image capture method illustrated in FIG. 4B, the amount of light emitted to the photodiode 221 is smaller than that in the image capture method illustrated in FIG. 4A. Consequently, the potential of the node in the image capture method illustrated in FIG. 4B is decreased more slowly than in the image capture method illustrated in FIG. 4A.

At a time H, the potential (V(152)) of the imaging-period control signal line 152 is set at a low-level potential (the storage operation ends). After that, the potential (V(N)) of the node has a fixed value.

At a time I, the potential (V(153)) of the reading-period control signal line 153 is set at a high-level potential (a selection operation starts). At this time, the potential (V(160)) of the read signal line 160 is changed in accordance with the potential (V(N)) of the node, that is, the gate voltage of the n-channel transistor 223 illustrated in FIG. 2C. Here, the potential (V(N)) of the node is higher in the image capture method illustrated in FIG. 4B than in the image capture method illustrated in FIG. 4A. As a result, the potential (V(160)) of the read signal line 160 is lower in the image capture method illustrated in FIG. 4B than in the image capture method illustrated in FIG. 4A.

At a time J, the potential (V(153)) of the reading-period control signal line 153 is set at a low-level potential (the selection operation ends). Thus, the potential (V(160)) of the read signal line 160 becomes a fixed value. After that, the potential (V(160)) of the read signal line 160 is judged by the imaging-signal read circuit 16.

In the display device disclosed in this specification, it is possible to detect a difference between data judged by the image capture method illustrated in FIG. 4A and data judged by the image capture method illustrated in FIG. 4B. Detection of the difference can reduce noise due to external light at the time of image capture, which leads to improvement in the accuracy of detecting an object.

<Variation of Display Device>

The above-described display device is an embodiment of the present invention, and the present invention also includes a display device different from the above display device.

Figure 5:
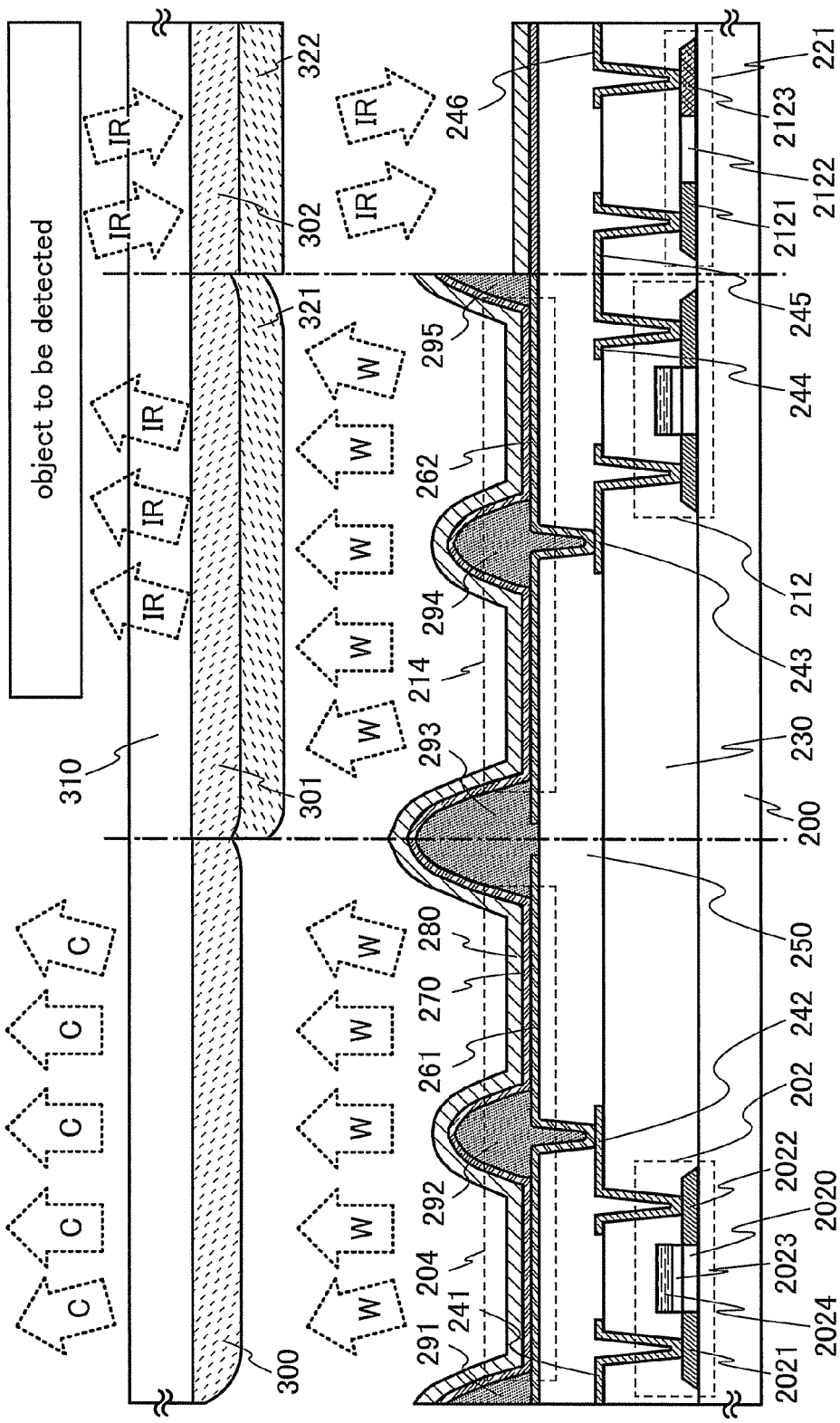
FIG. 5 is a cross-sectional view illustrating a structure example of a display device.

For example, the display device has the structure where an image is captured using white light (W) emitted from the light-emitting element 214 (see FIG. 3); alternatively, it is possible to employ a structure where an image is captured using invisible light (IR) including light with a wavelength in the infrared region (see FIG. 5). FIG. 5 is a cross-sectional view of a display device obtained by adding color filters 301 and 302 for absorbing light in the same wavelength region as that of light the color filter 300 absorbs and color filters 321 and 322 for absorbing light in a wavelength region different from that of light the color filter 300 absorbs, to the display device illustrated in FIG. 3. Here, white light (W) emitted from the light-emitting element 214 illustrated in FIG. 5 includes light with a wavelength in the infrared region. On the sealing substrate 310, the color filters 301 and 321 are stacked and the color filters 302 and 322 are stacked. The stack of the color filters 301 and 321 is provided directly above a region provided with the light-emitting element 214. The stack of the color filters 302 and 322 is provided directly above a region provided with the photodiode 221.

By using invisible light (IR) including light with a wavelength in the infrared region as described above, an image can be captured without adversely affecting display in the display device. Moreover, the intensity of invisible light (IR) can be increased without consideration of adverse effect on display, so that adverse effect of external light on the imaging element at the time of image capture can be reduced and the detection accuracy can be improved.

EXAMPLE 1

In this example, examples of electronic devices each including the above display device will be described with reference to FIGS. 6A to 6F.

Figure 6A:
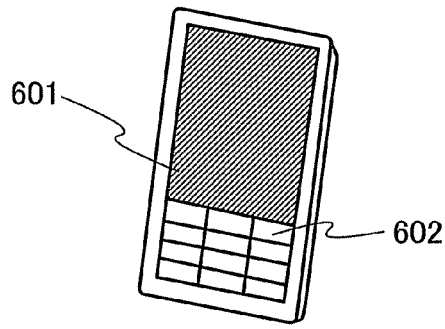
FIGS. 6A to 6F illustrate examples of electronic devices.

FIG. 6A illustrates a personal digital assistant. The personal digital assistant in FIG. 6A includes at least a display-and-imaging unit 601. In the personal digital assistant in FIG. 6A, for example, the display-and-imaging unit 601 can be provided with an operation unit 602. By using the display device for the display-and-imaging unit 601, operation of the personal digital assistant or input of data to the personal digital assistant can be performed with a finger or a pen, for example.

Figure 6B:
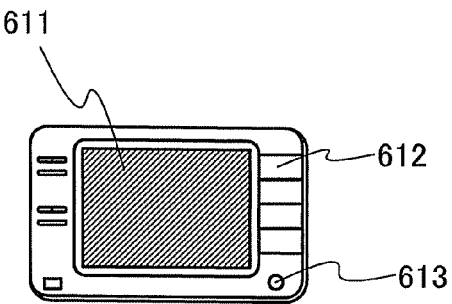

FIG. 6B illustrates an information guide terminal including an automotive navigation system. The information guide terminal in FIG. 6B includes a display-and-imaging unit 611, operation buttons 612, and an external input terminal 613. By using the display device for the display-and-imaging unit 611, operation of the information guide terminal or input of data to the information guide terminal can be performed with a finger or a pen, for example.

Figure 6C:
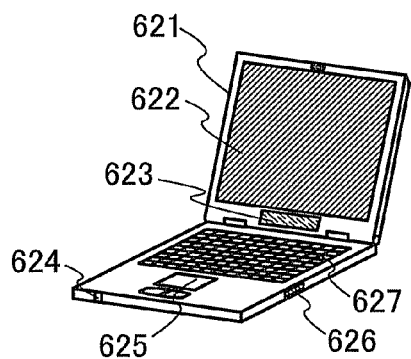

FIG. 6C illustrates a laptop personal computer. The laptop personal computer in FIG. 6C includes a housing 621, a display-and-imaging unit 622, a speaker 623, an LED lamp 624, a pointing device 625, a connection terminal 626, and a keyboard 627. By using the display device for the display-and-imaging unit 622, operation of the laptop personal computer or input of data to the laptop personal computer can be performed with a finger or a pen, for example.

Figure 6D:
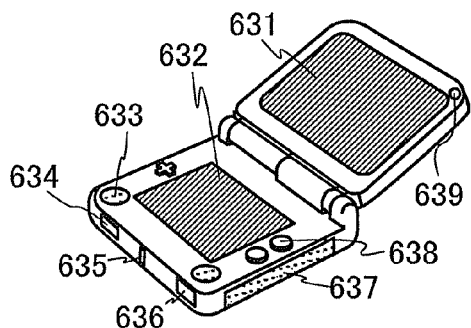

FIG. 6D illustrates a portable game machine. The portable game machine in FIG. 6D includes a display-and-imaging unit 631, a display-and-imaging unit 632, a speaker 633, a connection terminal 634, an LED lamp 635, a microphone 636, a recording medium read portion 637, operation buttons 638, and a sensor 639. By using the display device for the display-and-imaging unit 631 and/or the display-and-imaging unit 632, operation of the portable game machine or input of data to the portable game machine can be performed with a finger or a pen, for example.

Figure 6E:
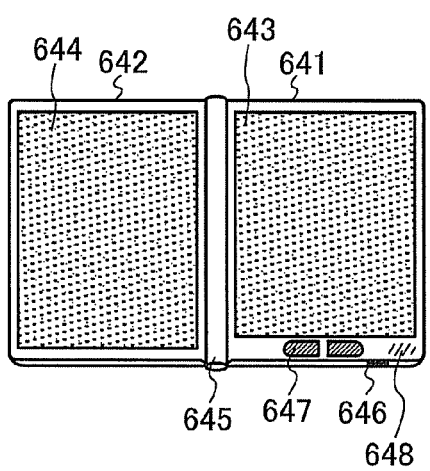

FIG. 6E illustrates an e-book reader. The e-book reader in FIG. 6E includes at least a housing 641, a housing 642, a display-and-imaging unit 643, a display-and-imaging unit 644, and a hinge 645.

The housing 641 and the housing 642 are connected to each other with the hinge 645 so that the e-book reader in FIG. 6E can be opened and closed with the hinge 645 as an axis. With such a structure, the e-book reader can be handled like a paper book. The display-and-imaging unit 643 and the display-and-imaging unit 644 are incorporated in the housing 641 and the housing 642, respectively. The display-and-imaging unit 643 and the display-and-imaging unit 644 can display different images; alternatively, one image can be displayed across both the display-and-imaging units. In the case where different images are displayed on the display-and-imaging unit 643 and the display-and-imaging unit 644, for example, text can be displayed on the display-and-imaging unit on the right side (the display-and-imaging unit 643 in FIG. 6E) and graphics can be displayed on the display-and-imaging unit on the left side (the display-and-imaging unit 644 in FIG. 6E).

In the e-book reader in FIG. 6E, the housing 641 or the housing 642 may be provided with an operation unit or the like. For example, the e-book reader in FIG. 6E can include a power button 646, operation keys 647, and a speaker 648. In the e-book reader in FIG. 6E, the pages of an image can be turned with the operation keys 647. Furthermore, in the e-book reader in FIG. 6E, a keyboard, a pointing device, or the like may be provided in at least one of the display-and-imaging unit 643 and the display-and-imaging unit 644. Moreover, an external connection terminal (e.g., an earphone terminal, a USB terminal, or a terminal connectable to an AC adapter or a variety of cables such as a USB cable), a recording medium insertion portion, and the like may be provided on a back surface or a side surface of the housing 641 and the housing 642 of the e-book reader in FIG. 6E. In addition, a function of an electronic dictionary may be added to the e-book reader in FIG. 6E.

By using the display device for the display-and-imaging unit 643 and/or the display-and-imaging unit 644, operation of the e-book reader or input of data to the e-book reader can be performed with a finger or a pen, for example.

Figure 6F:
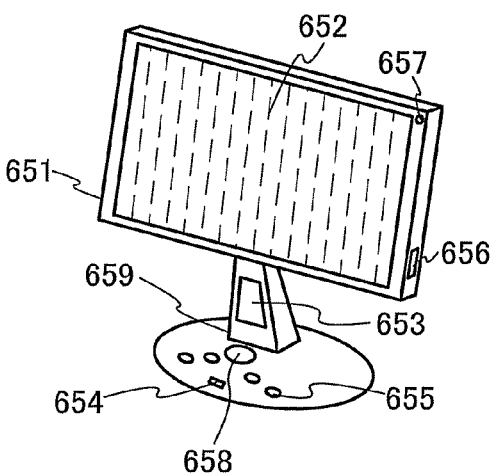

FIG. 6F illustrates a display. The display in FIG. 6F includes a housing 651, a display-and-imaging unit 652, a speaker 653, an LED lamp 654, operation buttons 655, a connection terminal 656, a sensor 657, a microphone 658, and a supporting base 659. By using the display device for the display-and-imaging unit 652, operation of the display or input of data to the display can be performed with a finger or a pen, for example.

This application is based on Japanese Patent Application serial No. 2010-248010 filed with Japan Patent Office on Nov. 5, 2010, the entire contents of which are hereby incorporated by reference.

What is claimed is:
1. A display device with an imaging function, comprising:
a plurality of display elements arranged in matrix each comprising:
a first light-emitting element; and
a first color filter;
a plurality of imaging elements arranged in matrix each comprising:
a second light-emitting element;
a second color filter;
a third color filter;
a photodiode;
a first transistor, one of a source and a drain of the first transistor being electrically connected to the photodiode;
a second transistor, a gate of the second transistor being electrically connected to the other of the source and the drain of the first transistor;
a third transistor, one of a source and a drain of the third transistor being electrically connected to the second light-emitting element; and
a fourth transistor, one of a source and a drain of the fourth transistor being electrically connected to a gate of the third transistor; and
an imaging light source driver circuit, wherein a gate of the fourth transistor in all of the plurality of imaging elements is electrically connected to the imaging light source driver circuit thorough a first common wiring, wherein the other of the source and the drain of the fourth transistor in all of the plurality of imaging elements is electrically connected to the imaging light source driver circuit through a second common wiring, wherein the first light-emitting element and the second light-emitting element are capable of emitting white light, wherein the second color filter and the third color filter overlap each other, wherein the first color filter is provided directly above the first light-emitting element, wherein the second color filter and the third color filter are provided directly above the second light-emitting element, wherein each of the first color filter, the second color filter and the third color filter has a property of transmitting visible light, and wherein each of the second color filter and the third color filter has a property of transmitting invisible light.

2. The display device with an imaging function, according to claim 1, wherein the light emitted from the first light-emitting element through the first color filter is any one of red light, green light, blue light, and yellow light.

3. The display device with an imaging function, according to claim 1, wherein each of the first light-emitting element and the second light-emitting element is an organic electroluminescent element.

4. The display device with an imaging function, according to claim 1, wherein a light-emitting layer is shared between the first light-emitting element and the second light-emitting element.

5. A display device with an imaging function, comprising:
a plurality of display elements arranged in matrix each comprising:
a first light-emitting element; and
a first color filter;
a plurality of imaging elements arranged in matrix each comprising:
a second light-emitting element;
a second color filter;
a third color filter;
a fourth color filter;
a fifth color filter;
a photodiode;
a first transistor, one of a source and a drain of the first transistor being electrically connected to the photodiode;
a second transistor, a gate of the second transistor being electrically connected to the other of the source and the drain of the first transistor;
a third transistor, one of a source and a drain of the third transistor being electrically connected to the second light-emitting element; and
a fourth transistor, one of a source and a drain of the fourth transistor being electrically connected to a gate of the third transistor; and
an imaging light source driver circuit,
wherein a gate of the fourth transistor in all of the plurality of imaging elements is electrically connected to the imaging light source driver circuit thorough a first common wiring,
wherein the other of the source and the drain of the fourth transistor in all of the plurality of imaging elements is electrically connected to the imaging light source driver circuit through a second common wiring, wherein the first light-emitting element and the second light-emitting element are capable of emitting white light, wherein the second color filter and the third color filter overlap each other, wherein the fourth color filter and the fifth color filter overlap each other, wherein the first color filter is provided directly above the first light-emitting element, wherein the second color filter and the third color filter are provided directly above the second light-emitting element, wherein the fourth color filter and the fifth color filter are provided directly above the photodiode, wherein each of the first color filter, the second color filter, the third color filter, the fourth color filter, and the fifth color filter has a property of transmitting visible light, and wherein each of the second color filter and the third color filter has a property of transmitting invisible light.

6. The display device with an imaging function, according to claim 5,
wherein the first color filter, the third color filter, and the fifth color filter are capable of absorbing light in a first wavelength region, and the second color filter and the fourth color filter are capable of absorbing light in a second wavelength region.

7. The display device with an imaging function, according to claim 5, wherein the light emitted from the first light-emitting element through the first color filter is any one of red light, green light, blue light, and yellow light.

8. The display device with an imaging function, according to claim 5, wherein each of the first light-emitting element and the second light-emitting element is an organic electroluminescent element.

9. The display device with an imaging function, according to claim 5, wherein a light-emitting layer is shared between the first light-emitting element and the second light-emitting element.

10. The display device with an imaging function, according to claim 1,
wherein each of the plurality of display elements comprises a fifth transistor electrically connected to the first light-emitting element,
wherein a W/L of the third transistor is higher than a W/L of the fifth transistor, and
wherein W represents a channel width and L represents a channel length.

11. The display device with an imaging function, according to claim 5,
wherein each of the plurality of display elements comprises a fifth transistor electrically connected to the first light-emitting element,
wherein a W/L of the third transistor is higher than a W/L of the fifth transistor, and
wherein W represents a channel width and L represents a channel length.

12. A display device with an imaging function, comprising:
a plurality of display elements arranged in matrix each comprising:
a first light-emitting element; and
a first color filter;
a plurality of imaging elements arranged in matrix each comprising:
a second light-emitting element;

a second color filter;
a third color filter;
a photodiode;
a first transistor, one of a source and a drain of the first transistor being electrically connected to the photodiode;
a second transistor, a gate of the second transistor being electrically connected to the other of the source and the drain of the first transistor;
a third transistor, one of a source and a drain of the third transistor being electrically connected to the second light-emitting element; and
a fourth transistor, one of a source and a drain of the fourth transistor being electrically connected to a gate of the third transistor; and
an imaging light source driver circuit,
wherein a gate of the fourth transistor in all of the plurality of imaging elements is electrically connected to the imaging light source driver circuit thorough a first common wiring,
wherein the other of the source and the drain of the fourth transistor in all of the plurality of imaging elements is electrically connected to the imaging light source driver circuit through a second common wiring,
wherein the first light-emitting element and the second light-emitting element are capable of emitting white light,
wherein the second color filter and the third color filter overlap each other,
wherein the first color filter is provided directly above the first light-emitting element,
wherein the second color filter and the third color filter are provided directly above the second light-emitting element,
wherein each of the first color filter, the second color filter, and the third color filter has a property of transmitting visible light,
wherein each of the second color filter and the third color filter has a property of transmitting invisible light, and
wherein the first color filter and the third color filter are capable of absorbing light in a first wavelength region, and the second color filter is capable of absorbing light in a second wavelength region.

13. The display device with an imaging function, according to claim 12, wherein the light emitted from the first light-emitting element through the first color filter is any one of red light, green light, blue light, and yellow light.

14. The display device with an imaging function, according to claim 12, wherein each of the first light-emitting element and the second light-emitting element is an organic electroluminescent element.

15. The display device with an imaging function, according to claim 12, wherein a light-emitting layer is shared between the first light-emitting element and the second light-emitting element.

16. The display device with an imaging function, according to claim 12,
wherein each of the plurality of display elements comprises a fifth transistor electrically connected to the first light-emitting element,
wherein a W/L of the third transistor is higher than a W/L of the fifth transistor, and
wherein W represents a channel width and L represents a channel length.

17. The display device with an imaging function, according to claim 1,
wherein a gate of the first transistor is electrically connected to a first signal line,
wherein one of a source and a drain of the second transistor is electrically connected to a potential line, and
wherein the other of the source and the drain of the second transistor is electrically connected a second signal line.

18. The display device with an imaging function, according to claim 5,
wherein a gate of the first transistor is electrically connected to a first signal line,
wherein one of a source and a drain of the second transistor is electrically connected to a potential line, and
wherein the other of the source and the drain of the second transistor is electrically connected a second signal line.

19. The display device with an imaging function, according to claim 12,
wherein a gate of the first transistor is electrically connected to a first signal line,
wherein one of a source and a drain of the second transistor is electrically connected to a potential line, and
wherein the other of the source and the drain of the second transistor is electrically connected a second signal line.

20. A display device with an imaging function, comprising:
a plurality of display elements arranged in matrix each comprising a first light-emitting element;
a plurality of imaging light source elements arranged in matrix each comprising:
a second light-emitting element;
a first transistor, one of a source and a drain of the first transistor being electrically connected to the second light-emitting element; and
a second transistor, one of source and a drain of the second transistor being electrically connected to a gate of the first transistor;
a plurality of optical sensors arranged in matrix each comprising a photodiode; and
an imaging light source driver circuit,
wherein a gate of the second transistor in all of the plurality of imaging light source elements is electrically connected to the imaging light source driver circuit through a first common wiring.

21. The display device with an imaging function, according to claim 20, wherein the other of the source and the drain of the second transistor in all of the plurality of imaging light source elements is electrically connected to the imaging light source driver circuit through a second common wiring.

22. The display device with an imaging function, according to claim 20, comprising a power source circuit electrically connected the plurality of display elements, the plurality of imaging light source elements, and the plurality of optical sensors.

23. The display device with an imaging function, according to claim 20, comprising a color filter overlapping with the first light-emitting element and not overlapping with the second light-emitting element and the photodiode.

24. The display device with an imaging function, according to claim 20, comprising:
a first color filter overlapping with the first light-emitting element, the second light-emitting element, and the photodiode; and
a second color filter overlapping with the second light-emitting element and the photodiode and not overlapping with the first light-emitting element.

* * * * *